(12) United States Patent
Voronin et al.

(10) Patent No.: US 12,628,594 B2
(45) Date of Patent: May 12, 2026

(54) METHOD FOR SELECTIVE ETCHING BY LOCAL PHOTON SURFACE ACTIVATION

(71) Applicant: Tokyo Electron Limited, Tokyo (JP)

(72) Inventors: Sergey Voronin, Albany, NY (US); Qi Wang, Albany, NY (US); Hamed Hajibabaeinajafabadi, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 271 days.

(21) Appl. No.: 18/320,775

(22) Filed: May 19, 2023

(65) Prior Publication Data

US 2024/0387186 A1 Nov. 21, 2024

(51) Int. Cl.
| | |
|---|---|
| *H10P 50/00* | (2026.01) |
| *H01J 37/32* | (2006.01) |
| *H10P 34/42* | (2026.01) |
| *H10P 50/24* | (2026.01) |
| *H10P 72/00* | (2026.01) |

(52) U.S. Cl.
CPC ........ *H10P 50/691* (2026.01); *H01J 37/3244* (2013.01); *H10P 34/42* (2026.01); *H10P 50/242* (2026.01); *H10P 72/0421* (2026.01); *H01J 2237/3341* (2013.01)

(58) Field of Classification Search
None
See application file for complete search history.

(56) References Cited

U.S. PATENT DOCUMENTS

| | | | |
|---|---|---|---|
| 2002/0177322 A1 | 11/2002 | Li et al. | |
| 2013/0130409 A1 | 5/2013 | Grimbergen | |
| 2015/0111315 A1 | 4/2015 | Grimbergen | |
| 2017/0358456 A1 * | 12/2017 | Tan .................. H01L 21/31116 | |
| 2018/0047574 A1 | 2/2018 | Grimbergen | |
| 2021/0263408 A1 * | 8/2021 | Grimbergen ............. G03F 1/22 | |
| 2021/0407790 A1 * | 12/2021 | Edley ................ H01L 21/67155 | |
| 2023/0335392 A1 * | 10/2023 | Yoshimoto .............. C23C 16/46 | |
| 2024/0053677 A1 * | 2/2024 | Sonnier ................. G03F 7/0002 | |

FOREIGN PATENT DOCUMENTS

WO WO-2019/217584 A1 11/2019

OTHER PUBLICATIONS

"Role of UV Irradiation during Si Etching Process in Chlorine Plasma" Butsurin Jinnai Et Al. 2007.11 Fifth international symposium on control of semiconductor interfaces (3 pages).
International Search Report and Written Opinion dated Jun. 27, 2024 on PCT App. PCT/US2024/018590 (9 pages).

* cited by examiner

*Primary Examiner* — Binh X Tran
(74) *Attorney, Agent, or Firm* — Foley & Lardner LLP

(57) ABSTRACT

A method for manufacturing semiconductor devices is disclosed. The method includes providing, in a chamber, a substate covered by a patterned mask. The method includes applying, in the chamber, radiation locally on a portion of the substate that is not covered by the patterned mask. The method includes etching, in the chamber, the portion of the substate through a dry etching process.

16 Claims, 5 Drawing Sheets

Operation 210

202 — PROVIDE SUBSTRATE COVERED BY PATTERNED MASK

204 — PLACE THE SUBSTRATE IN CHAMBER

206 — IDENTIFY ONE OR MORE PORTIONS OF THE SUBSTRATE

208 — LOCALLY APPLY RADIATION ON THE ONE OR MORE IDENTIFIED PORTIONS

210 — ETCH THE ONE OR MORE RADIATED PORTIONS W/ THE RADIATION REMAINING ACTIVATED

200

400

402 PROVIDE SUBSTRATE COVERED BY PATTERNED MASK

404 PLACE THE SUBSTRATE IN CHAMBER

406 IDENTIFY ONE OR MORE PORTIONS OF THE SUBSTRATE

408 LOCALLY APPLY RADIATION ON THE ONE OR MORE IDENTIFIED PORTIONS

410 ETCH THE ONE OR MORE RADIATED PORTIONS W/ THE RADIATION REMAINING INACTIVATED

METHOD FOR SELECTIVE ETCHING BY LOCAL PHOTON SURFACE ACTIVATION

FIELD OF THE DISCLOSURE

This disclosure relates to methods of manufacturing semiconductor devices and more particularly to methods of etching silicon-based materials with improved dimension control.

BACKGROUND

In the manufacture of a semiconductor device, various fabrication processes are executed such as film-forming depositions, etch mask creation, patterning, material etching and removal, and doping treatments. While semiconductor devices have scaled down with their feature sizes decreased and aspect ratios increased, such scaling efforts are running into greater challenges as scaling enters single digit nanometer semiconductor device fabrication processes. Although nanoscale semiconductor fabrication processes have been successfully demonstrated and implemented, various embodiments of the present disclosure may include increasing stability to form a number of semiconductor device elements or features.

SUMMARY

At least one aspect of the present disclosure is directed to a method for manufacturing semiconductor devices. The method includes providing, in a chamber, a substate covered by a patterned mask. The method includes applying, in the chamber, radiation locally on a portion of the substate that is not covered by the patterned mask. The method includes etching, in the chamber, the portion of the substate through a dry etching process.

In some embodiments, the substrate includes silicon.

In some embodiments, the radiation includes ultraviolet radiation with a power density greater than about 6 mW/cm$^2$.

In some embodiments, the dry etching process includes at least one of: a reactive ion etching (RIE) process, an ion beam assisted etching (IBAE) process, or a reactive ion beam etching (RIBE) process.

In some embodiments, the method further includes applying the radiation locally on the portion of the substate, concurrently with etching the portion of the substate.

In some embodiments, the method further includes (a) ceasing applying the radiation locally on the portion of the substate, while etching the portion of the substate; and (b) resuming applying the radiation locally on the portion of the substate, while ceasing etching the portion of the substate. The method further includes repeating step (a) and step (b).

In some embodiments, the method further includes providing, in the chamber, a second substate covered by a second patterned mask; and etching, in the chamber, a portion of the second substate through the dry etching process, without applying the radiation on the second substrate.

In some embodiments, an area of the portion of the substate, to which the radiation is applied, is in a range from tens of micrometers to a number of centimeters.

At least another aspect of the present disclosure is directed to a method for manufacturing semiconductor devices. The method includes providing a substate covered by a patterned mask. The method includes identifying a first portion and a second portion of the substrate that are exposed by the patterned mask. The method includes applying radiation only on the first portion of the substrate. The method includes etching the first portion and second portion of the substate through a dry etching process.

In some embodiments, the substrate includes silicon.

In some embodiments, the radiation includes ultraviolet radiation with a power density greater than about 6 mW/cm$^2$.

In some embodiments, the dry etching process includes at least one of: a reactive ion etching (RIE) process, an ion beam assisted etching (IBAE) process, or a reactive ion beam etching (RIBE) process.

In some embodiments, the method further includes applying the radiation on the first portion of the substate, concurrently with etching the first and second portions of the substate.

In some embodiments, the method further includes (a) ceasing applying the radiation on the first portion of the substate, while etching the first and second portions of the substate; and (b) resuming applying the radiation on the first portion of the substate, while ceasing etching the first and second portions of the substate. The method further includes repeating step (a) and step (b).

In some embodiments, an area of the first portion of the substate, to which the radiation is applied, is in a range from tens of micrometers to a number of centimeters.

Yet another aspect of the present disclosure is directed to an apparatus for manufacturing semiconductor devices. The apparatus includes a chamber comprising a plate configured to place a substrate that includes silicon; an inlet configured to supply one or more etchant gases into the chamber, wherein the etchant gases are ionized to create plasma; and a radiation source, when activated, configured to apply radiation locally on a portion of the substrate, wherein the radiation includes an ultraviolet radiation. The plasma is configured to etch the portion of the substate.

In some embodiments, the radiation source is configured to remain activated, concurrently with the plasma etching the portion of the substate.

In some embodiments, the radiation source is configured to be activated, alternately with the plasma etching the portion of the substate.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
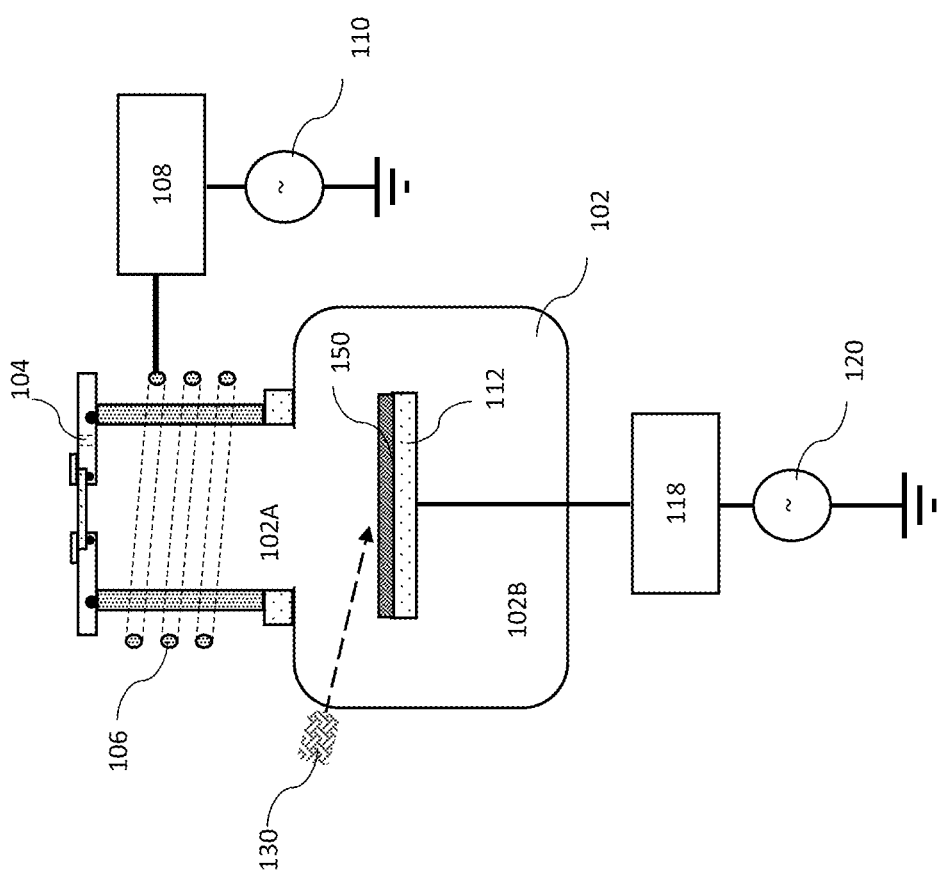
FIG. 1 illustrates a schematic view of an etching apparatus, according to some embodiments.
Figure 1:
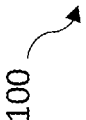

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

FIG. 1 illustrates a schematic view of an apparatus 100 for manufacturing semiconductor devices, in accordance with various embodiments of the present disclosure. For example, the apparatus 100 can be configured to perform one or more etching process through plasma on a selected portion of a substrate with improved etching selectivity. The apparatus 100 can include one or more radiation source selectively applied (e.g., focused) on such selected portions to improve the etching selectivity. The etching process may be a dry etching process, but it should be appreciated that other type of etching processes may be used while remaining within the scope of the present disclosure.

In the illustrated embodiment of FIG. 1, the apparatus 100 is implemented as an inductively coupled plasma (ICP) etching system, in which the energy for generating a plasma source of the apparatus 100 is supplied by electric currents which are produced by electromagnetic induction. However, it should be understood that the plasma source of the apparatus 100 can be generated by any of various other types of techniques such as, for example, a capacitively coupled plasma source, a magnetically enhanced plasma source, or a helicon plasma source, while remaining within the scope of the present disclosure.

As shown in FIG. 1, the apparatus 100 includes a chamber 102 that may include a first portion 102A and a second portion 102B. The first portion 102A may be configured as where a plasma source is generated, which is sometimes referred to as plasma chamber 102A. The second portion 102B may be configured as where a workpiece is etched through the generated plasma, which is sometimes referred to as process (or diffusion) chamber 102B.

The plasma chamber 102A can include a gas inlet 104 for introducing gases into the plasma chamber 102A. This gas inlet 104 can be coupled to a gas delivery system (not shown) for delivering one or more gases. For example, the gas delivery system can be configured to delivery of $SF_6$, $C_4F_8$, Ar, $O_2$, $CH_4$, $CHF_3$, $CF_4$, $Cl_2$, Xe, Ne, $N_2$, or $NF_3$, or any combinations thereof. The plasma chamber 102A can also be associated with an antenna or coil 106, an RF matching or tuning network 108, and an RF power supply 110 to provide the energy for generating the plasma in the plasma chamber 102A.

The process chamber 102B can include a substrate holder 112 for supporting and securing workpiece 150, which may be a semiconductor wafer or substrate. In some embodiments, the substrate holder 112 can be configured such that the position (e.g., the height) of the substrate in the process chamber 102B can be changed as required to reduce or increase the distance between the plasma chamber 102A and the substrate. During etching, the temperature of the substrate can be controlled using back side Helium cooling lines coupling the substrate holder 112 to a chiller (not shown). The He cooling lines can be configured to allow temperatures between –20-50° C. The substrate holder 112 can be further configured to serve as an electrode coupled to a second RF generator or power supply 120 via a second RF matching/tuning network 118 to provide substrate bias. This second RF generator 120 and second RF matching/tuning network 118 can be configured to be decoupled from and operate independently of the RF generator 110 and RF matching tuning network 108 associated with the plasma chamber 102A.

According to various embodiments of the present disclosure, the apparatus 100 further includes a radiation source 130 that can apply focused radiation on a certain portion of the substrate 150. The radiation source 130 may be implemented as an ultraviolet (UV) source that can provide radiation with a wavelength of about 200~380 nanometers (nm). Although not shown, the radiation source 130 can include or be operatively coupled to a number of optical components, which allows the radiation to be locally focused on one or more selected portion of the substrate 150. By configuring these optical components, an area of the selected portion of the substate 150, to which the radiation is applied, can be flexibly configured in the range from about tens of micrometers to a number of centimeters. Further, a power density of the radiation, applied on the selected portion of the substate 150, can be greater than about 6 $mW/cm^2$. Still further, an exposure time of the radiation, applied on the selected portion of the substate 150, can be flexibly configured.

For example, the radiation source 130 can include or be operatively coupled to one or more focusing mirrors, and one or more aperture components. The focusing mirrors can be formed in the shape of ellipsoids of rotation with different diameters or in the form of paraboloids of rotation with different diameters. These focusing mirrors are arranged coaxially such that the center axes of rotation come to rest on one another so that the focal positions essentially agree with one another. These focusing mirrors can advantageously reflect the UV radiation with an oblique angle of incidence of 0° to 25°. The aperture components can provide an opening (e.g., a circular opening) positioned along an optical path or axis between the focusing mirror and the selected portion of the substrate 150.

The apparatus 100 is configured to perform one or more dry etching processes on the selected portion of the substrate 150 through the plasma (generated in the plasma chamber 102A). The dry etching process can include reactive ion etching (RIE), ion beam assisted etching (IBAE), and reactive ion beam etching (RIBE), such as microwave plasma dry etching, each of which involves a chemically reactive vapor or gaseous species, for example, comprising a halogen, such as $F_2$, $Br_2$ or $Cl_2$, in a vapor phase compound.

In the case of RIE employing a reactive gas, such as $BCl_3$, damage to the semiconductor materials is, to a degree, less compared to that of ion etching. In any case, damage to the surface of semiconductor materials under this etching treatment is still major and not acceptable. In order to reduce the damage, the gas pressure of the etching system may be raised while lowering the discharge power. In IBAE, a combination of ions from an inert gas, e.g., $Ar_+$, from an ion beam source and a flux of chemically active species, e.g., F or Cl, are directed to the sample and by control of the ion beam and the reactive species, a controlled anisotropic etching can be carried out. In RIBE, the source of ions (e.g., $Cl^+$) and radicals (e.g., $Cl^*$) is generally formed in and extracted out of a separate chamber and accelerated via an ion extraction grid or electrode into the etching chamber.

Generally, the above-described reactive dry etching processes provide a source of reactive species in the form of either reactive ions, e.g., $Cl^+$, or reactive radicals, e.g., $Cl^*$, or a combination of reactive ions and radicals forming a reactive flux, e.g., $Cl^+$ and $Cl^*$, or a source of reactive species assisted by other ions, e.g., $Cl^+$ and/or $Cl^*$ in combination with $Ar^+$, that are generated, focused and/or accelerated to the sample target to provide a chemical action at the selected portion of the substate 150. However, given the increasingly shrinking size and/or dimension of features to be etched in the modern semiconductor devices, an etching rate with solely using the dry etching process may not be ideal enough. With the selected portion of the substate 150 processed by the radiation, a certain amount of defects can be generated in such portions. As a result, the dry etching process can advantageously increase an etching rate on such processed portions.

Figure 2:
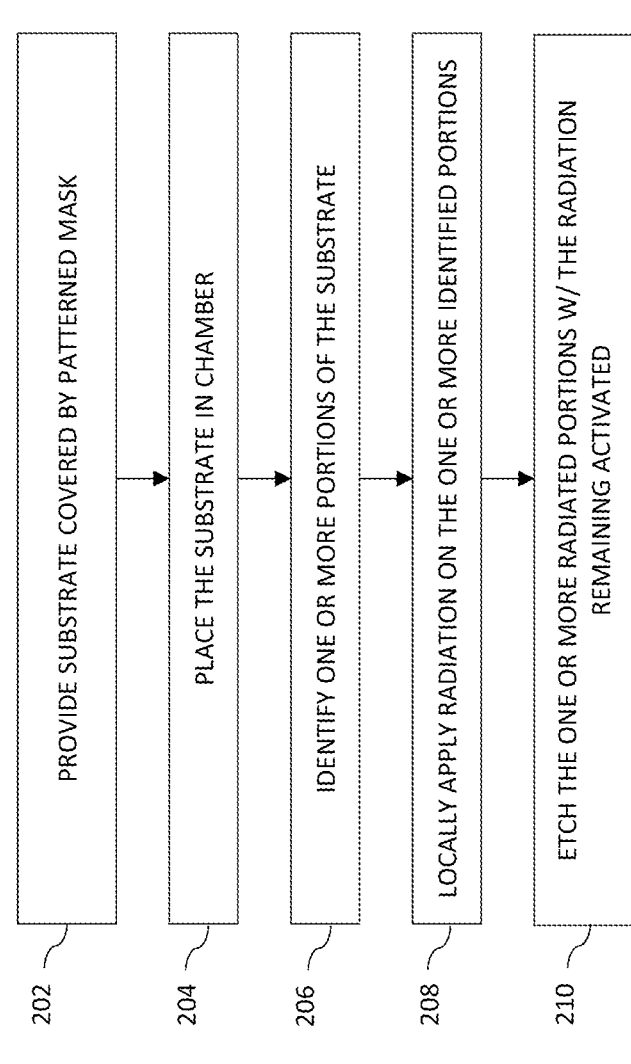
FIG. 2 illustrates a flow chart of an example method for fabricating one or more features of a semiconductor device through the etching apparatus of FIG. 1, according to some embodiments.
Figure 3:
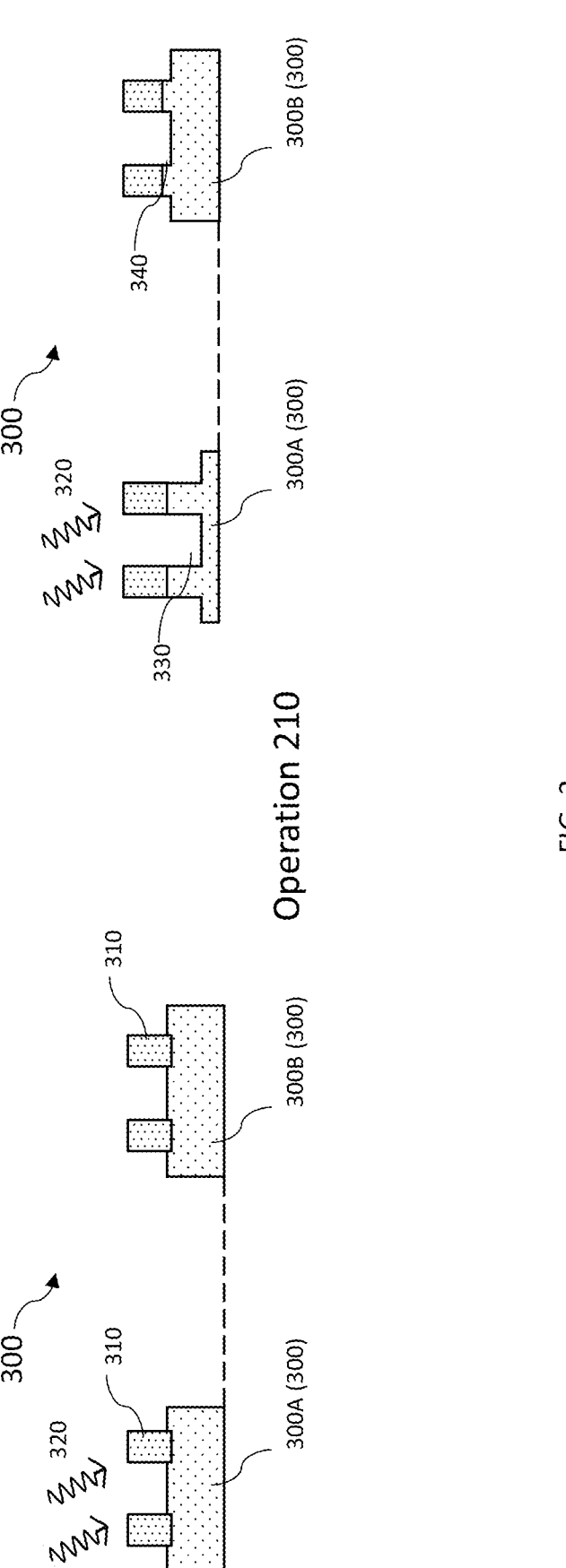
FIG. 3 illustrates cross-sectional views of portions of a semiconductor device that have features formed by the method of FIG. 2, according to some embodiments.

FIG. 2 illustrates a flowchart of an example method 200 to form a semiconductor device using the disclosed etching apparatus 100, according to one or more embodiments of the present disclosure. For example, at least some of the operations (or steps) of the method 200 can be used to form, through one or more dry etching processes, one or more recesses in a substrate that includes a silicon-based material. Such recesses can be later filled with a conductive material (e.g., metal) so as to form a number of conductive features, in one aspect of the present disclosure. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example semiconductor device 300 at various fabrication stages as shown in FIG. 3, respectively, which will be discussed in further detail below. It should be understood that the semiconductor device 300 may not include a completed semiconductor device for the purposes of brevity.

The method 200 starts with operation 202 in which a substrate covered by a patterned mask is provided, in accordance with some embodiments. For example in FIG. 3, a substrate 300 covered by a patterned mask 310 is provided. The substrate 300 may be a semiconductor substrate, such as a bulk semiconductor, a semiconductor-on-insulator (SOI) substrate, or the like, which may be doped (e.g., with a p-type or an n-type dopant) or undoped. The substrate 300 may be a wafer, such as a silicon wafer. Other substrates, such as a multi-layered or gradient substrate may also be used. In some embodiments, the semiconductor material of the substrate 300 may include silicon or a silicon-based material. In some other embodiments, the semiconductor material of the substrate 300 may include germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The patterned mask 310 may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. Further, in some embodiments, the substrate 300 may include multiple regions, areas, or otherwise portions (e.g., 300A, 300B) covered by respective patterns.

The method 200 proceeds to operation 204 in which the substate is placed in the chamber of an etching apparatus, in accordance with some embodiments. Such an etching apparatus may be an example of the apparatus 100 discussed above. Specifically, the etching apparatus may include a radiation source that can locally apply radiation on one or more selected portions of the substrate 300. Referring again to FIG. 1, the substate 300, covered by the patterned mask 310, may be placed on the substrate holder 112.

The method 200 proceeds to operation 206 in which one or more portions of the substrate are identified, in accordance with some embodiments. Referring again to FIG. 3, prior to etching the substate 300, the portion that requires to be radiated, e.g., 300A, may be identified, and the portion that does not require to be radiated, e.g., 300B, may also be identified. For example, the portions 300A and 300B may be identified based on their respective feature densities, in which the portion 300A has a higher feature density than the portion 300B does. In another example, the portions 300A and 300B may be identified based on their respective aspect ratios to be formed, in which the portion 300A has a feature with a higher aspect ratio than the portion 300B does.

The method 200 proceeds to operation 208 in which radiation is locally applied on the one or more identified portions, in accordance with some embodiments. Referring again to FIG. 3 in conjunction with FIG. 1, upon the portion 300A being identified, the radiation source 130 can apply radiation 320 (e.g., UV) only on the portion 300A. Stated another way, the portion 300B is free from being applied with the radiation 320. As described above, by configuring the radiation source 130 (and its operatively coupled optical components), various parameters of the radiation 320 can be configured such as, for example, an area of the radiation 320, a power density of the radiation 320, a time duration of the radiation 320, etc.

The method 200 proceeds to operation 210 in which the one or more radiated portions are etched, with the radiation remaining activated, in accordance with some embodiments. Referring to FIG. 3 in conjunction with FIG. 1, the radiation source 130 may remain activated to apply the radiation 320 on the portion 300A, while the portions 300A and 300B are being etched in the process chamber 102B. As shown in FIG. 3, the portion 300A, processed (e.g., radiated or otherwise exposed) by the radiation 320, may have recesses 330 formed with a relatively deeper depth, while the portion 300B, free from the radiation 320, may have recesses 340 formed with a relatively shallower depth.

Figure 4:
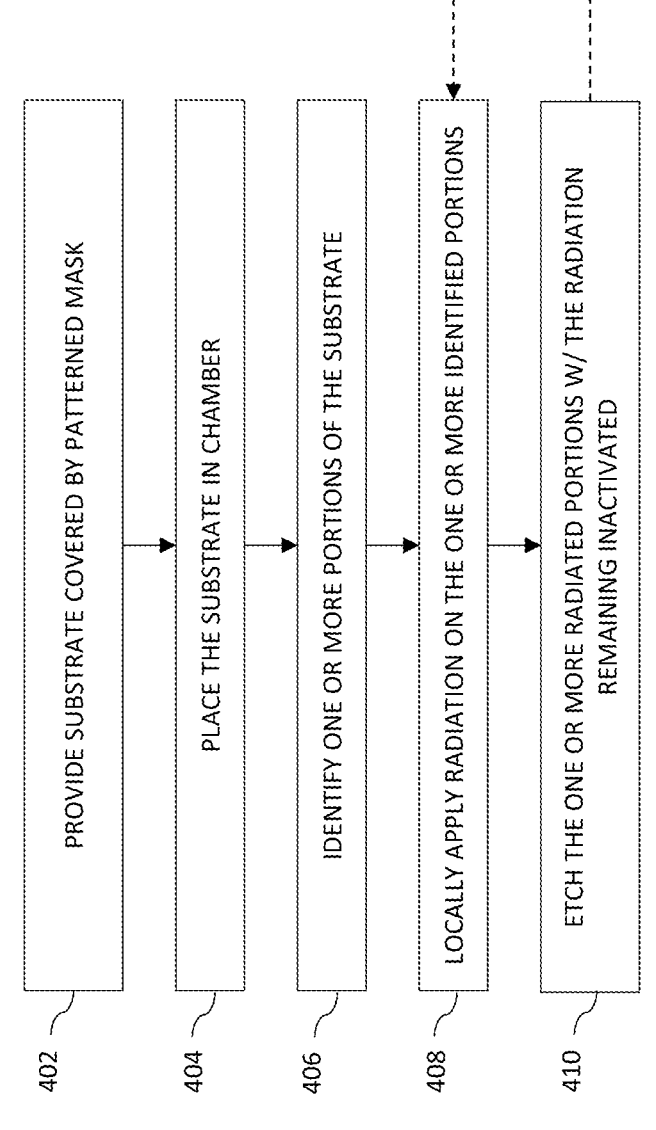
FIG. 4 illustrates a flow chart of another example method for fabricating one or more features of a semiconductor device through the etching apparatus of FIG. 1, according to some embodiments.
Figure 5:
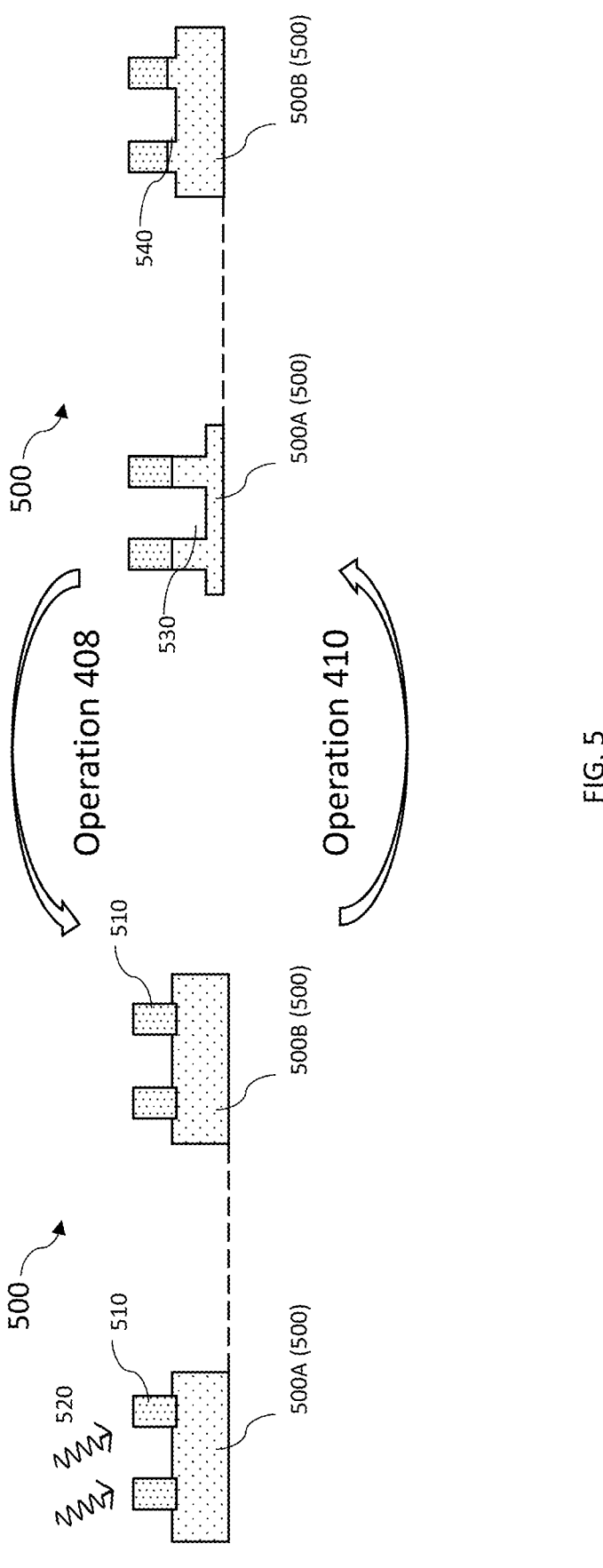
FIG. 5 illustrates cross-sectional views of portions of a semiconductor device that have features formed by the method of FIG. 4, according to some embodiments.

FIG. 4 illustrates a flowchart of another example method 400 to form a semiconductor device using the disclosed etching apparatus 100, according to one or more embodiments of the present disclosure. For example, at least some of the operations (or steps) of the method 400 can be used to form, through one or more dry etching processes, one or more recesses in a substrate that includes a silicon-based material. Such recesses can be later filled with a conductive material (e.g., metal) so as to form a number of conductive features, in one aspect of the present disclosure. It is noted that the method 400 is merely an example, and is not intended to limit the present disclosure. Accordingly, it is understood that additional operations may be provided before, during, and after the method 400 of FIG. 4, and that some other operations may only be briefly described herein. In some embodiments, operations of the method 400 may be associated with cross-sectional views of an example semiconductor device 500 at various fabrication stages as shown in FIG. 5, respectively, which will be discussed in further detail below. It should be understood that the semiconductor device 500 may not include a completed semiconductor device for the purposes of brevity.

The method 400 starts with operation 402 in which a substrate covered by a patterned mask is provided, in accordance with some embodiments. For example in FIG. 5, a substrate 500 covered by a patterned mask 510 is provided. The substrate 500 may be a semiconductor substrate, such as a bulk semiconductor, a semiconductor-on-insulator (SOI) substrate, or the like, which may be doped (e.g., with a p-type or an n-type dopant) or undoped. The substrate 500 may be a wafer, such as a silicon wafer. Other substrates, such as a multi-layered or gradient substrate may also be used. In some embodiments, the semiconductor material of the substrate 500 may include silicon or a silicon-based material. In some other embodiments, the semiconductor material of the substrate 500 may include germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The patterned mask 510 may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. Further, in some embodiments, the substrate 500 may include multiple regions, areas, or otherwise portions (e.g., 500A, 500B) covered by respective patterns.

The method 400 proceeds to operation 404 in which the substate is placed in the chamber of an etching apparatus, in accordance with some embodiments. Such an etching apparatus may be an example of the apparatus 100 discussed above. Specifically, the etching apparatus may include a radiation source that can locally apply radiation on one or more selected portions of the substrate 500. Referring again to FIG. 1, the substate 500, covered by the patterned mask 510, may be placed on the substrate holder 112.

The method 400 proceeds to operation 406 in which one or more portions of the substrate are identified, in accordance with some embodiments. Referring again to FIG. 5, prior to etching the substate 500, the portion that requires to be radiated, e.g., 500A, may be identified, and the portion that does not require to be radiated, e.g., 500B, may also be identified. For example, the portions 500A and 500B may be identified based on their respective feature densities, in which the portion 500A has a higher feature density than the portion 300B does. In another example, the portions 500A and 500B may be identified based on their respective aspect ratios to be formed, in which the portion 500A has a feature with a higher aspect ratio than the portion 500B does.

The method 400 proceeds to operation 408 in which radiation is locally applied on the one or more identified portions, in accordance with some embodiments. Referring again to FIG. 5 in conjunction with FIG. 1, upon the portion 500A being identified, the radiation source 130 can apply radiation 520 (e.g., UV) only on the portion 500A. Stated another way, the portion 500B is free from being applied with the radiation 520. As described above, by configuring the radiation source 130 (and its operatively coupled optical components), various parameters of the radiation 520 can be configured such as, for example, an area of the radiation 520, a power density of the radiation 520, a time duration of the radiation 520, etc.

The method 400 proceeds to operation 410 in which the one or more radiated portions are etched, with the radiation remaining inactivated, in accordance with some embodiments. Referring to FIG. 5 in conjunction with FIG. 1, the radiation source 130 may remain inactivated, while the portions 500A and 500B are being etched in the process chamber 102B. As shown in FIG. 5, the portion 500A, processed (e.g., radiated or otherwise exposed) by the radiation 520, may have recesses 530 formed with a relatively deeper depth, while the portion 500B, free from the radiation 520, may have recesses 540 formed with a relatively shallower depth. In some embodiments, operations 408 and 410 may be performed more than once. For example, after the portion 500A is processed by the radiation 520 (operation 408), the radiation 520 may be shut off while etching the portions 500A and 500B (operation 410), and such an operation loop may be iteratively performed more than once.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for manufacturing a semiconductor device, comprising:
   providing, in a chamber, a substrate covered by a patterned mask;
   applying, in the chamber, radiation locally on a first portion of the substrate that is not covered by the patterned mask and not applying radiation on a second portion that is not covered by the patterned mask, wherein applying the radiation modifies the portion of the substrate and increases a local etch rate of the portion relative to the second, unirradiated portion of the substrate; and
   etching, in the chamber, the first portion of the substrate and the second, unirradiated portion of the substrate through a dry etching process, concurrently with applying the radiation locally on and increasing the local etch rate of the first portion of the substrate that is not covered by the patterned mask.

2. The method of claim 1, wherein the substrate includes silicon.

3. The method of claim 1, wherein the radiation includes ultraviolet radiation with a power density greater than about 6 mW/cm².

4. The method of claim 1, wherein the dry etching process includes at least one of: a reactive ion etching (RIE) process, an ion beam assisted etching (IBAE) process, or a reactive ion beam etching (RIBE) process.

5. The method of claim 1, further comprising:
   providing, in the chamber, a second substrate covered by a second patterned mask; and
   etching, in the chamber, a portion of the second substrate through the dry etching process, without applying the radiation on the second substrate.

6. The method of claim 1, wherein an area of the first portion of the substrate, to which the radiation is applied, is in a range from tens of micrometers to a plurality of centimeters.

7. The method of claim 1, further comprising:
   (a) ceasing applying the radiation locally on the first portion of the substrate, while etching the first portion and the second portion of the substrate; and
   (b) resuming applying the radiation locally on the first portion of the substrate, while ceasing etching the first portion and the second portion of the substrate.

8. The method of claim 7, further comprising repeating step (a) and step (b).

9. A method for manufacturing a semiconductor device, comprising:
   providing a substrate covered by a patterned mask;
   identifying a first portion and a second portion of the substrate that are exposed by the patterned mask;
   applying radiation only on the first portion of the substrate, wherein applying the radiation modifies the portion of the substrate and increases a local etch rate of the first portion relative to the second portion of the substrate; and
   etching the first portion and second portion of the substrate through a dry etching process.

10. The method of claim 9, wherein the substrate includes silicon.

11. The method of claim 9, wherein the radiation includes ultraviolet radiation with a power density greater than about 6 mW/cm².

12. The method of claim 9, wherein the dry etching process includes at least one of: a reactive ion etching (RIE) process, an ion beam assisted etching (IBAE) process, or a reactive ion beam etching (RIBE) process.

13. The method of claim 9, further comprising:
   applying the radiation on the first portion of the substrate, concurrently with etching the first and second portions of the substrate.

14. The method of claim 9, wherein an area of the first portion of the substrate, to which the radiation is applied, is in a range from tens of micrometers to a plurality of centimeters.

15. The method of claim 9, further comprising:
   (a) ceasing applying the radiation on the first portion of the substrate, while etching the first and second portions of the substrate; and
   (b) resuming applying the radiation on the first portion of the substrate, while ceasing etching the first and second portions of the substrate.

16. The method of claim 15, further comprising repeating step (a) and step (b).

* * * * *